US012795844B2

(12) United States Patent
Zeng et al.

(10) Patent No.: US 12,795,844 B2
(45) Date of Patent: Nov. 10, 2026

(54) DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Jia Zeng, Beijing (CN); Shaokui Liu, Beijing (CN); Wei Zeng, Beijing (CN); Chuan Zeng, Beijing (CN); Chuankun You, Beijing (CN); Wei Qing, Beijing (CN); Zhihui Wang, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 380 days.

(21) Appl. No.: 18/576,721

(22) PCT Filed: Apr. 21, 2023

(86) PCT No.: PCT/CN2023/089843

§ 371 (c)(1),
(2) Date: Jan. 4, 2024

(87) PCT Pub. No.: WO2023/207802

PCT Pub. Date: Nov. 2, 2023

(65) Prior Publication Data

US 2024/0341047 A1 Oct. 10, 2024

(30) Foreign Application Priority Data

Apr. 27, 2022 (CN) ........................ 202210459283.0

(51) Int. Cl.
*H05K 5/02* (2006.01)
*H10K 59/80* (2023.01)
(Continued)

(52) U.S. Cl.
CPC ....... *H05K 5/0226* (2013.01); *H10K 59/8791* (2023.02); *H10K 77/111* (2023.02); *H10K 2102/311* (2023.02)

(58) Field of Classification Search
CPC ..... G09F 9/301; H05K 5/0226; G06F 1/1681; G06F 1/1652
See application file for complete search history.

(56) References Cited

U.S. PATENT DOCUMENTS 9,119,316 B2 * 8/2015 Lee ..................... H04M 1/0268
9,778,682 B2 * 10/2017 Lee ....................... G06F 1/1641
(Continued)

FOREIGN PATENT DOCUMENTS

CN 104900153 A 9/2015
CN 112863356 A 5/2021
(Continued)

OTHER PUBLICATIONS

CN202210459283.0 Notification to grant patent right for invention dated Sep. 28, 2023.

*Primary Examiner* — Abhishek M Rathod
(74) *Attorney, Agent, or Firm* — IPro, PLLC

(57) ABSTRACT

A display apparatus including a folding bracket and a flexible display panel. The folding bracket includes a base and two folding mechanisms, and the two folding mechanisms are rotatably connected to the base respectively and are capable of being unfolded and folded relative to each other. The flexible display panel includes a support layer and a panel body that are separated from each other, and each of the support layer and the panel body is connected to the two
(Continued)

folding mechanisms. Each of the two folding mechanisms is configured to drive the panel body and the support layer to move in staggered directions.

19 Claims, 15 Drawing Sheets

(51) Int. Cl.
*H10K 77/10* (2023.01)
*H10K 102/00* (2023.01)

(56) References Cited

U.S. PATENT DOCUMENTS

| | | | | |
|---|---|---|---|---|
| 9,791,892 | B2 * | 10/2017 | Park | G06F 1/1681 |
| 9,980,373 | B2 * | 5/2018 | Jeong | H05K 1/028 |
| 10,368,452 | B2 * | 7/2019 | Yun | G09F 9/301 |
| 11,119,534 | B2 * | 9/2021 | Lee | G06F 1/1616 |
| 11,256,304 | B2 * | 2/2022 | Mehandjiysky | H04M 1/0216 |
| 11,609,612 | B2 * | 3/2023 | Park | G06F 1/1677 |
| 2012/0264489 | A1 * | 10/2012 | Choi | H04M 1/0247 455/566 |
| 2012/0314399 | A1 * | 12/2012 | Bohn | H04M 1/0268 361/679.01 |
| 2014/0355195 | A1 * | 12/2014 | Kee | G06F 1/1652 361/679.27 |
| 2015/0257289 | A1 | 9/2015 | Lee et al. | |
| 2019/0200470 | A1 * | 6/2019 | Woo | E05D 11/10 |
| 2019/0361494 | A1 * | 11/2019 | Wu | H04M 1/0268 |
| 2020/0022267 | A1 * | 1/2020 | Han | B32B 15/18 |
| 2020/0326751 | A1 * | 10/2020 | Kim | G06F 1/1616 |
| 2021/0389809 | A1 * | 12/2021 | Choi | G06F 1/1647 |
| 2022/0240399 | A1 | 7/2022 | Dong | |
| 2023/0180409 | A1 | 6/2023 | Park et al. | |
| 2023/0247782 | A1 * | 8/2023 | Cao | H05K 5/0217 361/807 |
| 2024/0032227 | A1 | 1/2024 | Cheng et al. | |
| 2024/0040723 | A1 | 2/2024 | Feng | |

FOREIGN PATENT DOCUMENTS

| | | | |
|---|---|---|---|
| CN | 113053238 | A | 6/2021 |
| CN | 113066377 | A | 7/2021 |
| CN | 113299195 | A | 8/2021 |
| CN | 113990202 | A | 1/2022 |
| CN | 113990203 | A | 1/2022 |
| CN | 114743462 | A | 7/2022 |
| EP | 4063996 | A1 | 9/2022 |
| WO | 2019209060 | A1 | 10/2019 |
| WO | 2022068290 | A1 | 4/2022 |

* cited by examiner

DISPLAY APPARATUS

The present disclosure is a US national stage of international application No. PCT/CN2023/089843, filed on Apr. 21, 2023, which claims priority to Chinese Patent Application No. 202210459283.0, filed on Apr. 27, 2022 and entitled "DISPLAY APPARATUS", the entire contents of which are incorporated herein by reference.

TECHNICAL FIELD

The present disclosure relates to the field of display apparatuses, and in particular, to a display apparatus.

BACKGROUND OF THE INVENTION

With the development of mobile terminal technologies, mobile terminals are used more and more extensively, and have become one of important tools in people's daily work and life. Foldable mobile terminals are gradually favored by people because they occupy small space are convenient to carry.

Generally, a foldable mobile terminal includes a folding bracket and a flexible display panel. The folding bracket may be unfolded and folded relative to each other. The flexible display panel is disposed on one side of the folding bracket. When the folding bracket is unfolded, the flexible display panel is unfolded on the folding bracket. When the folding bracket is folded, the flexible display panel is folded between two portions of the folding bracket that are folded relative to each other.

SUMMARY OF THE INVENTION

An embodiment of the present disclosure provides a display apparatus. The display apparatus includes a folding bracket and a flexible display panel.

The folding bracket includes a base and two folding mechanisms. The two folding mechanisms are rotatably connected to the base respectively, and are capable of being unfolded and folded relative to each other.

The flexible display panel includes a support layer and a panel body that are separated from each other. The support layer is disposed on the back surface of the panel body. The back surface is a surface opposite to the display surface of the panel body. Each of the support layer and the panel body is connected to the two folding mechanisms.

Each of the folding mechanisms is configured to drive the panel body and the support layer to move in staggered directions. In a case that the two folding mechanisms are unfolded relative to each other, the moving direction of the panel body relative to the support layer points to the base. In a case that the two folding mechanisms are folded relative to each other, the moving direction of the panel body relative to the support layer points away from the base.

Optionally, the folding mechanism includes a first swing member and a second swing member;

the first swing member and the second swing member are rotatably connected to the base separately; and the first swing member and the second swing member are slidably connected to each other; the first swing member is movable in a direction towards or away from the base relative to the second swing member; and the maximum distance between the first swing member and the rotation axial line of the second swing member in a folded state is greater than the maximum distance between the first swing member and the rotation axial line of the second swing member in an unfolded state.

Optionally, the support layer is connected to the second swing members of each of the two folding mechanisms; and the panel body is connected to the first swing members of each of the two folding mechanisms.

Optionally, a surface of the base proximal to the flexible display panel is provided with a mounting groove, and the mounting groove includes a bottom wall and at least one side wall; and the first swing member includes a swing arm and a pin shaft; a first end of the swing arm is disposed in the mounting groove; a second end of the swing arm is disposed outside the mounting groove; and the pin shaft is connected to the swing arm and the side wall of the mounting groove.

Optionally, in the unfolded state, a side surface of the swing arm is in contact with the bottom wall; the distance from the pin shaft to the end surface of the first end of the swing arm is greater than the distance from the pin shaft to the bottom wall; and in the folded state, the end surface of the first end of the swing arm is in contact with the bottom wall.

Optionally, there is a rounded corner at the joint between a first side surface of the swing arm and the end surface of the first end of the swing arm; and the first side surface is the side surface of the swing arm in contact with the bottom wall in the unfolded state.

Optionally, the side wall is provided with a guide groove; the angle between the extending direction of the guide groove and the bottom wall is not zero degrees; one end of the pin shaft is connected to the swing arm; and the other end of the pin shaft is disposed in the guide groove and is movable along the guide groove; or a surface of the swing arm is provided with a guide groove; the guide groove extends along the length direction of the swing arm; one end of the pin shaft is connected to the side wall; and the other end of the pin shaft is disposed in the guide groove and is movable along the guide groove.

Optionally, the extending direction of the guide groove is perpendicular to the bottom wall.

Optionally, the folding mechanism further includes an elastic member; and the elastic member is disposed in the guide groove and is connected to a side wall of the guide groove and the pin shaft.

Optionally, a surface of the swing arm is provided with a guide slot; the guide slot extends along a length direction of the swing arm; and the second swing member is connected to the guide slot and is slidable along the guide slot relative to the swing arm.

Optionally, the second swing member includes a support plate; and an edge of the support plate is disposed in the guide slot.

Optionally, the surface of the base proximal to the flexible display panel is provided with an arc-shaped groove; and the second swing member further includes an arc-shaped arm; the arc-shaped arm is disposed on the side of the support plate distal from the flexible display panel and is disposed on the edge of the support plate proximal to the base; and one end of the arc-shaped arm is connected to the support plate; and the other end of the arc-shaped arm is disposed in the arc-shaped groove.

Optionally, the base includes two sub-bases which are spaced from each other; and each of the two sub-bases is connected with the two folding mechanisms.

Optionally, the folding mechanism further includes a first synchronous gear and a synchronous swing arm; the first synchronous gear is rotatably connected to the base; the rotation axial line of the first synchronous gear is parallel to the rotation axial line of the second swing member; and the first synchronous gears of the two folding mechanisms are in transmission connection with each other; and one end of the synchronous swing arm is connected to the first synchronous gear; the other end of the synchronous swing arm is movably connected to the second swing member; and the synchronous swing arm is configured to drive the first synchronous gear to rotate under an action of the second swing member.

Optionally, the second swing member further includes a connecting portion connected to the support plate; the connecting portion is disposed on the side of the support plate distal from the flexible display panel and is disposed on a side of the synchronous swing arm; the connecting portion is provided with a sliding groove; and the synchronous swing arm slidingly matches up with the sliding groove.

Optionally, the synchronous swing arm includes a rod portion and a sliding portion; one end of the rod portion is connected to the first synchronous gear; the other end of the rod portion is connected to the sliding portion; and the sliding portion is disposed in the sliding groove and is movable along the sliding groove.

Optionally, the display apparatus further includes a flexible block; and in the unfolded state, the flexible block is disposed between end surfaces of first ends of swing arms of the two folding mechanisms.

Optionally, the panel body includes a bottom film, a display function layer, a polarizer, and a cover plate that are laminated sequentially; and the display function layer includes a substrate and an organic light-emitting diode disposed on the substrate.

Optionally, the orthographic projections of the bottom film, the display function layer, and the polarizer on a surface of the cover plate are all within the cover plate.

Optionally, the support layer includes a support layer main body and a flexible layer; and the flexible layer is disposed on the surface of the support layer main body proximal to the panel body.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

DETAILED DESCRIPTION

To make the objectives, technical solutions, and advantages of the present disclosure clearer, the following further describes implementations of the present disclosure in detail with reference to the accompanying drawings.

Unless otherwise defined, the technical terms or scientific terms used herein should have general meanings understood by those of ordinary skill in the field to which the present disclosure pertains. “First”, “second”, “third”, and similar words used in the description and the claims of the present disclosure do not denote any order, quantity, or importance, but are merely intended to distinguish between different constituents. Similarly, “one”, “a”, and similar words do not indicate a quantitative limitation, but indicate at least one. “Include”, “comprise”, or a similar word indicates that an element or article before the word covers elements, articles, or equivalents listed after the word, without precluding the possibility of covering other elements or articles. “Connection”, “connect”, or a similar word is not limited to physical or mechanical connection, and may include electrical connection, and the connection may be direct or indirect. Words “on”, “under”, “left”, “right”, and the like are merely used to indicate relative location relationships. When an absolute location of a described object changes, its relative location relationship may also change accordingly.

During bending of an object, stress is generated at a bent portion. The smaller the bending radius, the higher the stress, and for the same radius, the thicker the object, the higher the stress. The same is true for a flexible display panel. Generally, a foldable mobile terminal includes a folding bracket and a flexible display panel. The folding bracket may be unfolded and folded relative to each other to unfold or fold the flexible display panel. However, during bending of the flexible display panel, the flexible display panel is affected by stress at a bent portion. The smaller the bending radius, the higher the stress. As a result, the flexible display panel is easy to be damaged.

Figure 1:
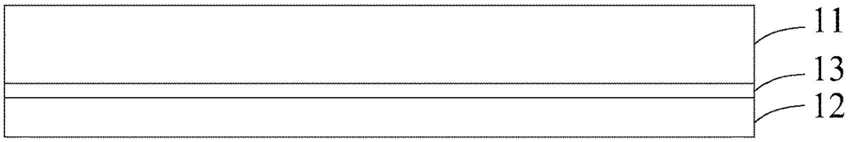
FIG. 1 is a schematic structural diagram of a flexible display panel in a related art.

FIG. 1 is a schematic structural diagram of a flexible display panel in the related art. As shown in FIG. 1, the flexible display panel includes a panel body 11 and a support layer 12. The panel body 11 includes a front surface and a back surface that are opposite to each other. The front surface is a display surface for displaying. The support layer 12 is disposed on the back surface of the panel body 11. The support layer 12 is connected to the panel body 11, for example, it is adhered to the panel body 11 by a pressure-sensitive adhesive layer 13. During bending of the flexible display panel, the higher the stress at a bent portion, the higher possibility of damage to the flexible display panel, thereby affecting the service life of the flexible display panel. Generally, to pursue a smaller bending radius, the thicker the flexible display panel, the easier to be damaged and the shorter its service life, as a result.

Figure 2:
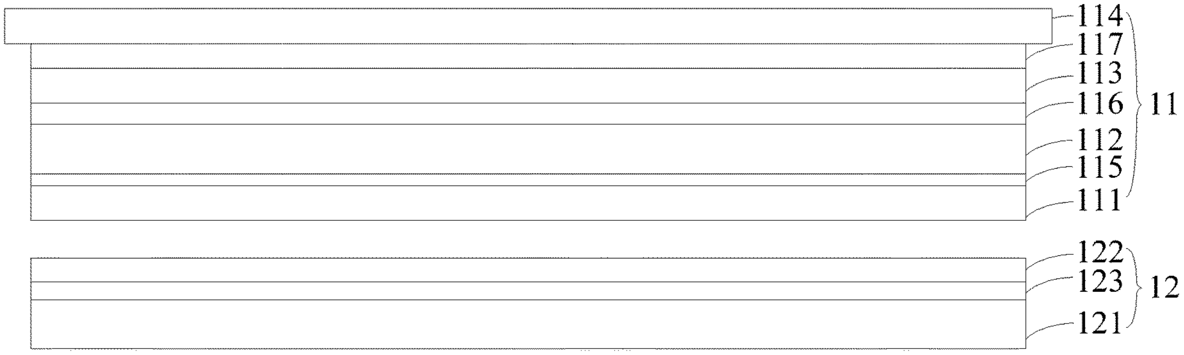
FIG. 2 is a schematic structural diagram of a flexible display panel according to an embodiment of the present disclosure.

FIG. 2 is a schematic structural diagram of a flexible display panel according to an embodiment of the present disclosure. As shown in FIG. 2, the flexible display panel includes a panel body 11 and a support layer 12 that are separated from each other. In other words, the support layer 12 is disposed at the back surface of the panel body 11 but the support layer 12 is not connected to the panel body 11.

As an example, the panel body 11 includes a bottom film 111, a display function layer 112, a polarizer 113, and a cover plate 114 that are laminated sequentially. For example, the flexible display panel is an organic light-emitting diode display panel. In this case, the display function layer 112 may include a substrate and an organic light-emitting diode disposed on the substrate. The display function layer 112 is connected to the bottom film 111 by a first pressure-sensitive adhesive layer 115. The polarizer 113 is connected to the display function layer 112 by a second pressure-sensitive adhesive layer 116. The cover plate 114 is connected to the polarizer 113 by an optical clear adhesive 117. The orthographic projections of the bottom film 111, the display function layer 112, and the polarizer 113 on a surface of the cover plate 114 are all within the cover plate 114. In other words, edges of the cover plate 114 exceed the bottom film 111, the display function layer 112, and the polarizer 113 which may facilitate mounting of the panel body 11. For details, refer to subsequent descriptions. At least a region of the cover plate 114 corresponding to the display function layer 112 is light-transmitting.

The support layer 12 includes a support layer main body 121 and a flexible layer 122. For example, the support layer main body 121 is adhered to the flexible layer 122 by a third pressure-sensitive adhesive layer 123. The flexible layer 122 is disposed on the surface of the support layer main body 121 proximal to the panel body 11 to separate the support layer main body 121 from the panel body 11. The flexible layer 122 is relatively soft and is capable of preventing the support layer main body 121 from damaging the panel body 11. The support layer main body 121 may be a metal sheet, which can not only be bendable but also perform a support function so that the flexible display panel can be kept flat. For example, the support layer main body 121 is a stainless steel sheet.

Generally, the service life of the support layer 12 is relatively long. Damage, which is caused by stress generated in a folding process, generally occurs on the panel body 11. Once the panel body 11 is damaged, it will generally cause the flexible display panel cannot perform displaying normally.

Figure 3:
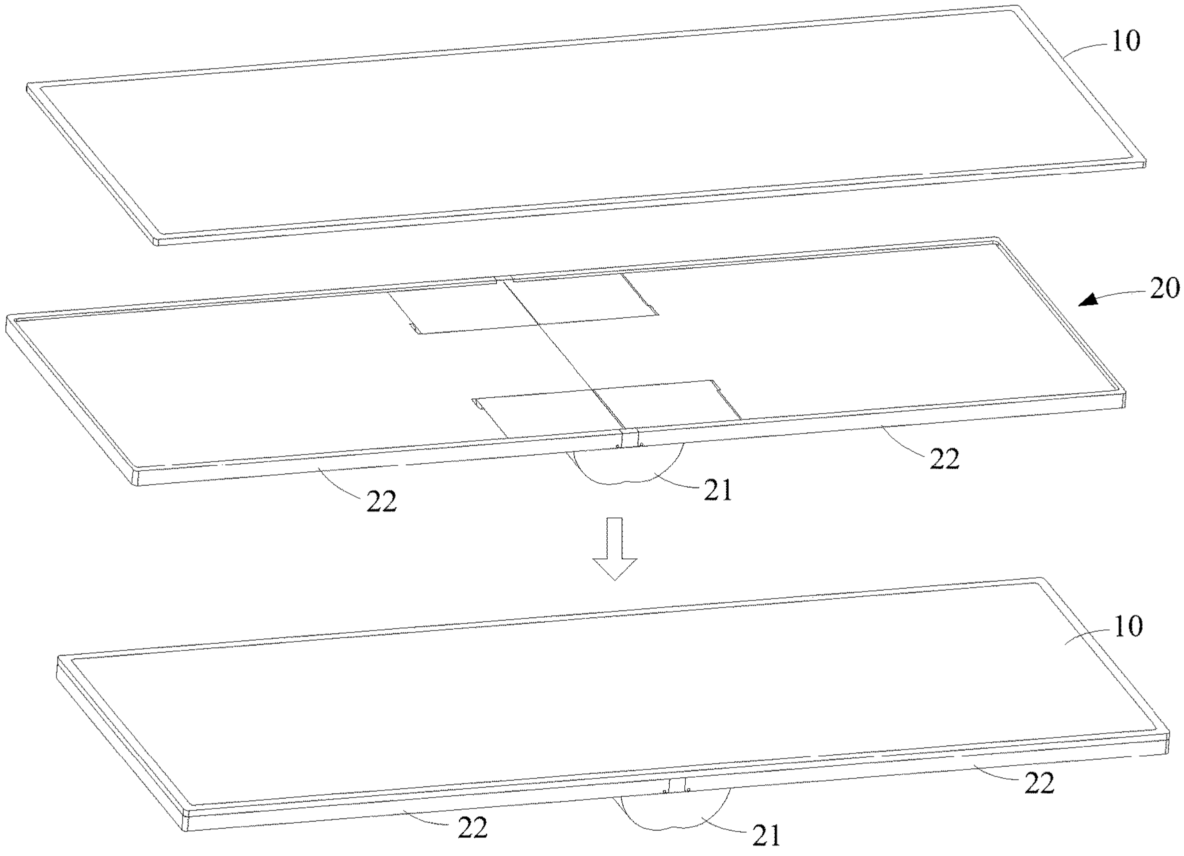
FIG. 3 is a schematic structural diagram of a display apparatus according to an embodiment of the present disclosure.

FIG. 3 is a schematic structural diagram of a display apparatus according to an embodiment of the present disclosure. The display apparatus may be but is not limited to a mobile phone or a tablet computer. Embodiments of the present disclosure are described by using a mobile phone as an example. As shown in FIG. 3, the display apparatus includes a folding bracket 20 and a flexible display panel 10.

The folding bracket 20 includes a base 21 and two folding mechanisms 22. The two folding mechanisms 22 are rotatably connected to the base 21 respectively, and are capable of being unfolded and folded relative to each other. The display apparatus has an unfolded state and a folded state. When the display apparatus is in the unfolded state, the two folding mechanisms 22 of the folding bracket 20 are unfolded. When the display apparatus is in the folded state, the two folding mechanisms 22 of the folding bracket 20 are folded.

The flexible display panel 10 includes a support layer 12 and a panel body 11 that are separated from each other. For example, the flexible display panel 10 may be the flexible display panel shown in FIG. 2.

In the display apparatus, the support layer 12 is disposed on the back surface of the panel body 11. Each of the support layer 12 and the panel body 11 is connected to both the two folding mechanisms 22.

Figure 4:
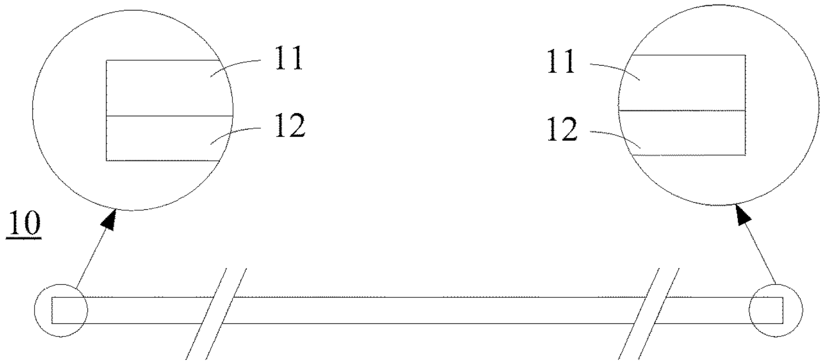
FIG. 4 is a schematic structural diagram of a flexible display panel in an unfolded state.
Figure 5:
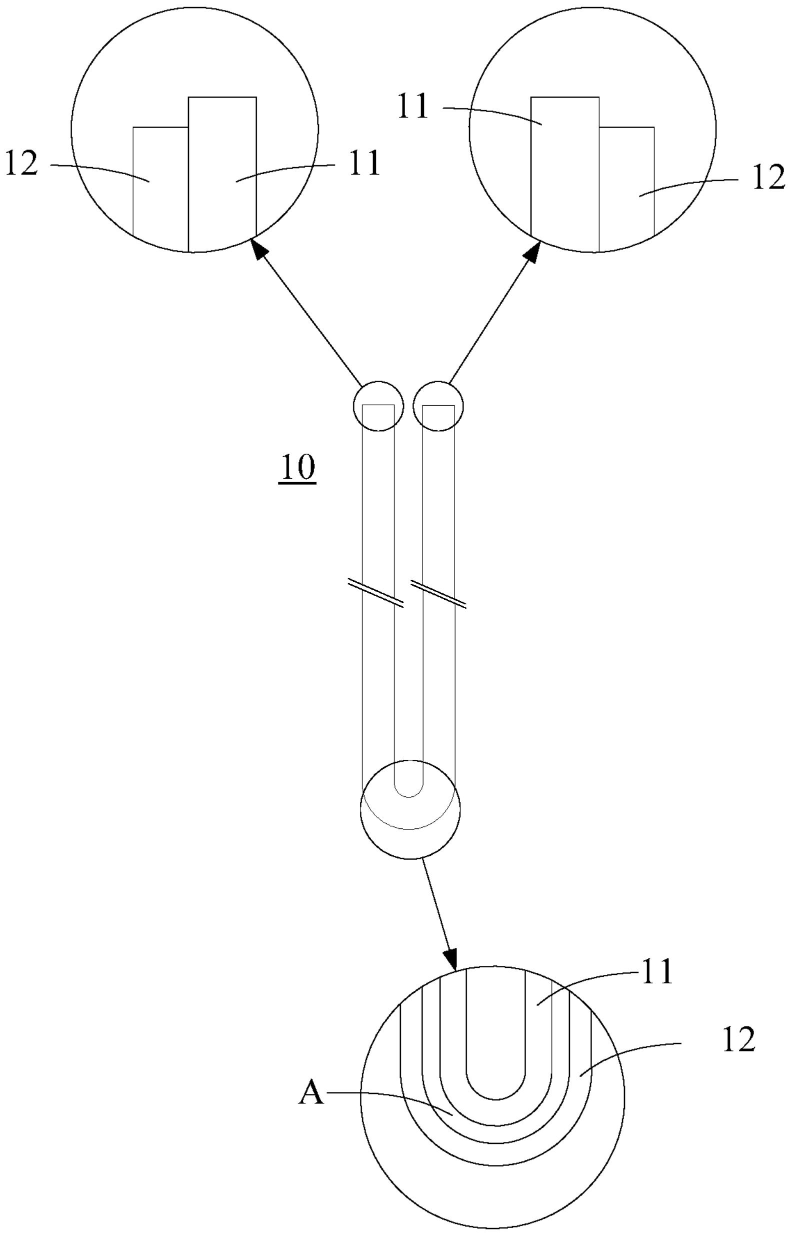
FIG. 5 is a schematic structural diagram of a flexible display panel in a folded state.

FIG. 4 is a schematic structural diagram of the flexible display panel in the unfolded state. FIG. 5 is a schematic structural diagram of the flexible display panel in the folded state. With reference to FIG. 4 and FIG. 5, the folding mechanisms 22 are configured to drive the panel body 11 and the support layer 12 to move in staggered directions. When the two folding mechanisms 22 are unfolded relative to each other, the moving direction of the panel body 11 relative to the support layer 12 points to the base 21. When the two folding mechanisms 22 are folded relative to each other, the moving direction of the panel body 11 relative to the support layer 12 points away from the base 21.

Herein, the two folding mechanisms 22 being unfolded relative to each other means that an opening angle between the two folding mechanisms 22 or an opening angle of the flexible display panel increases gradually. The two folding mechanisms 22 being folded relative to each other means that the opening angle between the two folding mechanisms 22 or the opening angle of the flexible display panel decreases gradually.

The support layer 12 and the panel body 11 are respectively connected to the folding mechanisms 22 by setting the support layer 12 and the panel body 11 of the flexible display panel 10 in a manner of being separated from each other. Unfolding and folding of the folding mechanisms 22 are used to make the support layer 12 and the panel body 11 to move in staggered directions. In a folding process, the moving direction of the panel body 11 relative to the support layer 12 points away from the base 21, so that when the folded state is reached, a bent portion of the panel body 11 and a bent portion of the support layer 12 are separated from each other. As shown in FIG. 5, a gap A is formed between the bent portion of the panel body 11 and the bent portion of support layer 12, which reduces stress on the bent portion of the panel body 11, and is conducive to avoiding damage to the flexible display panel and prolonging the service life of the flexible display panel. When the two folding mechanisms 22 are unfolded relative to each other, the moving direction of the panel body 11 relative to the support layer 12 points to the base 21, so that the panel body 11 and the support layer 12 can be attached to each other in the unfolded state to keep the flexible display panel 10 flat.

In addition, because stress on the bent portion of the panel body 11 in the folded state is reduced, on the premise that the panel body 11 is prevented from being damaged, the display apparatus in the embodiments of the present disclosure can be bent with smaller bending radius, compared with that of the display apparatus in the related art, which is conducive to reducing the thickness of the display apparatus in the folded state in a case that the service life is ensured to meet a requirement.

Figure 6:
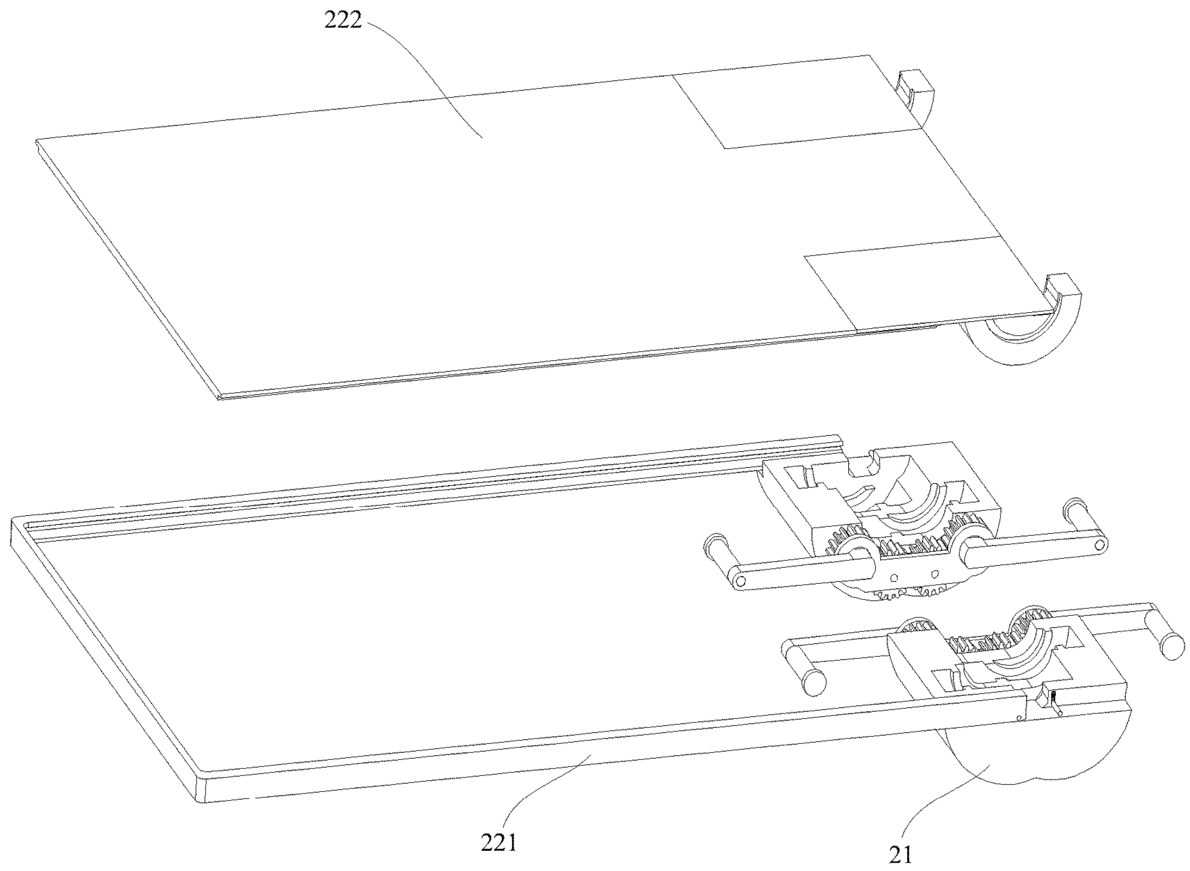
FIG. 6 is a schematic diagram of a breakdown structure of a folding mechanism and a base according to an embodiment of the present disclosure.

FIG. 6 is a schematic diagram of a breakdown structure of a folding mechanism and a base according to an embodiment of the present disclosure. As shown in FIG. 6, the folding mechanism 22 includes a first swing member 221 and a second swing member 222.

The first swing member 221 and the second swing member 222 are rotatably connected to the base 21 respectively such that both the first swing member 221 and the second swing member 222 can rotate relative to the base 21.

The first swing member 221 and the second swing member 222 are slidably connected to each other. The first swing member 221 is movable in a direction towards or away from the base 21 relative to the second swing member 222.

Figure 7:
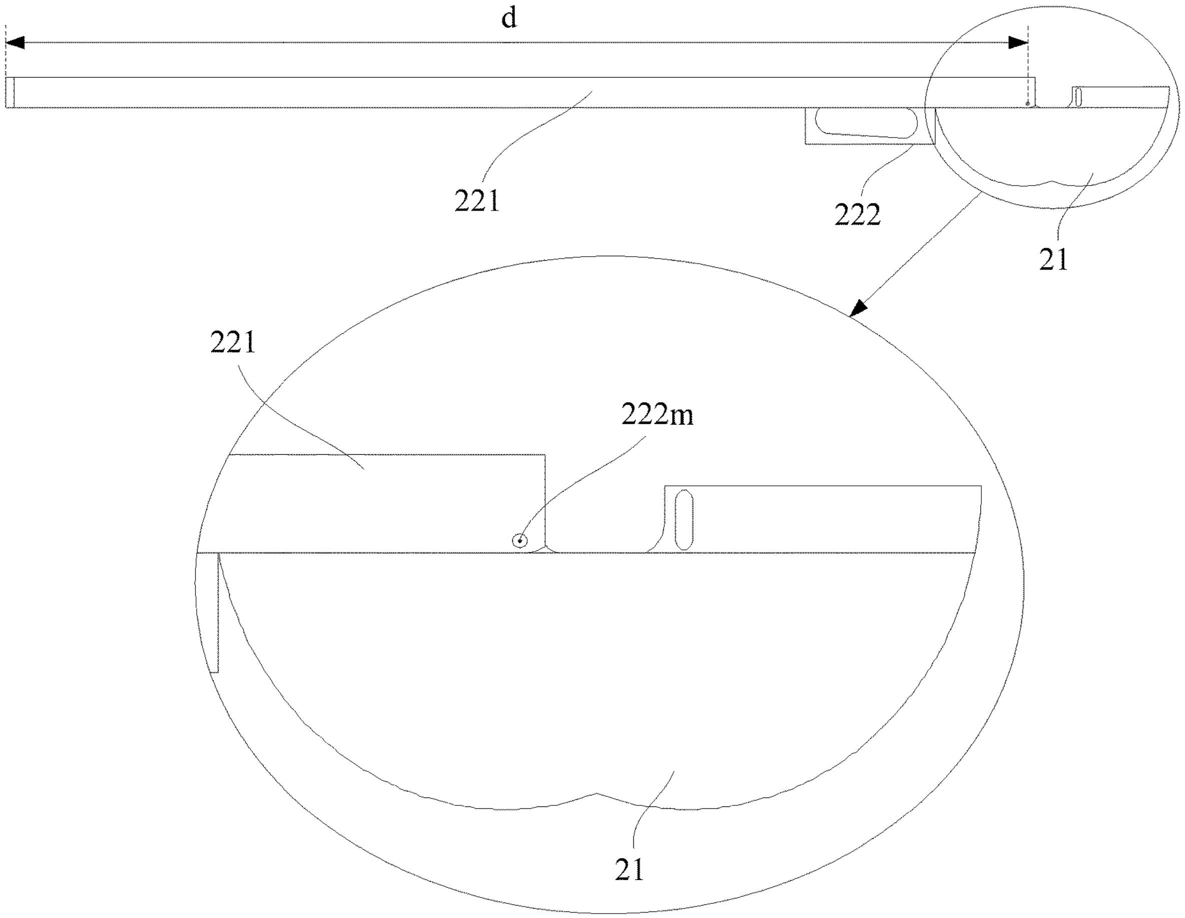
FIG. 7 is a schematic diagram of connection between a folding mechanism and a base according to an embodiment of the present disclosure.
Figure 8:
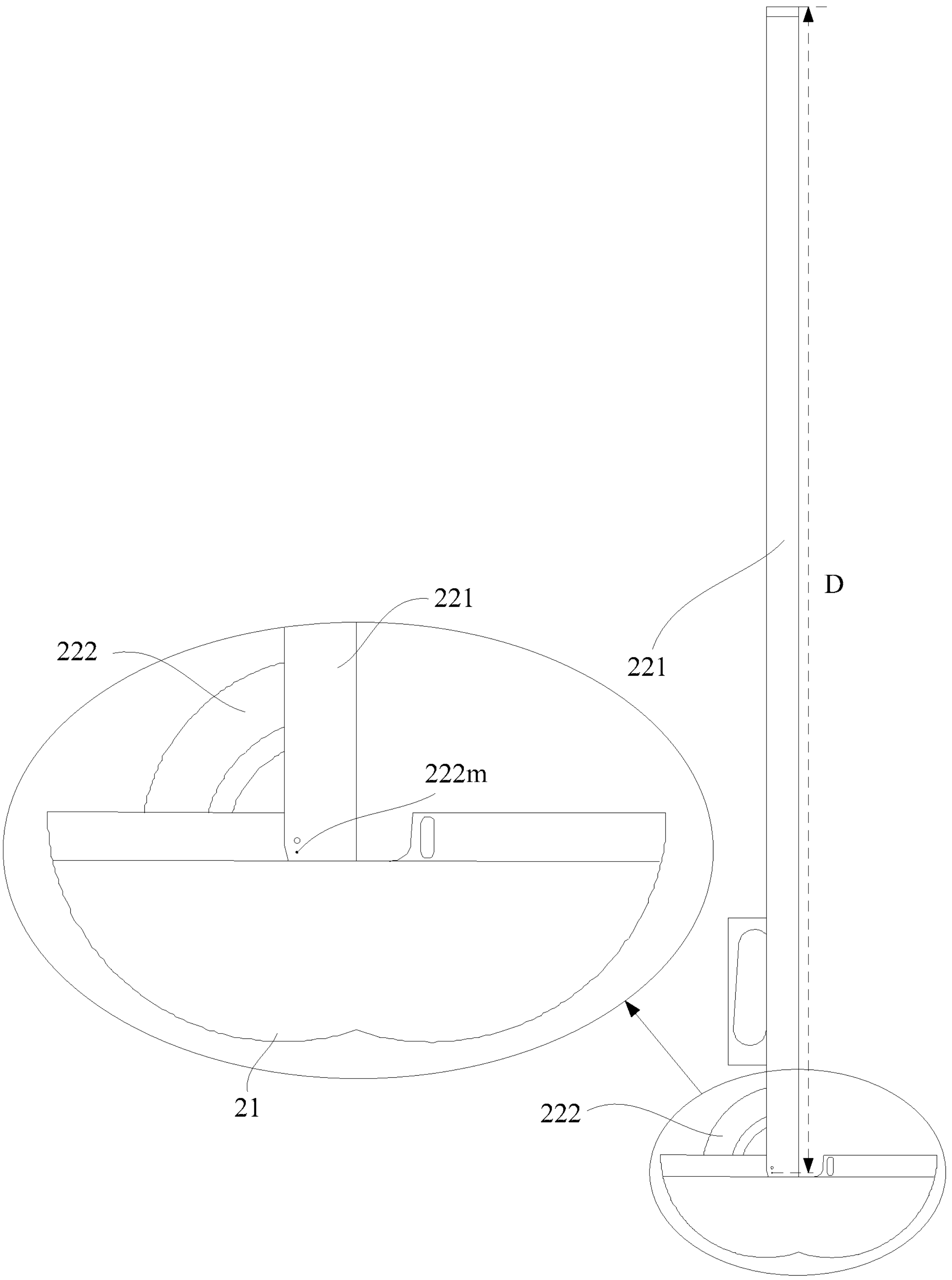
FIG. 8 is a schematic diagram of connection between a folding mechanism and a base according to an embodiment of the present disclosure.

Both FIG. 7 and FIG. 8 are schematic diagrams of connection between a folding mechanism and a base according to an embodiment of the present disclosure. FIG. 7 shows an unfolded state and FIG. 8 shows a folded state. As shown in FIG. 7 and FIG. 8, a maximum distance D between the first swing member 221 and a rotation axial line 222*m* of the second swing member 222 in the folded state is greater than a maximum distance d between the first swing member 221 and the rotation axial line 222*m* of the second swing member 222 in the unfolded state.

The support layer 12 is respectively connected to the second swing members 222 of the two folding mechanisms 22. The panel body 11 is respectively connected to the first swing members 221 of the two folding mechanisms 22.

The maximum distance between the first swing member 221 and the rotation axial line 222*m* of the second swing member 222 may be a distance between an edge of one end of the first swing member 221 distal from the base 21 and the rotation axial line 222*m* of the second swing member 222. The flexible display panel 10 is carried on the two folding mechanisms 22. Two portions of the panel body 11 that can be bent to each other are respectively connected to the first swing members 221 of the two folding mechanisms 22. The maximum distance between the first swing member 221 and the rotation axial line of the second swing member 222 may alternatively be a distance between the rotation axial line 222*m* of the second swing member 222 and a side edge, distal from the rotation axial line 222*m* of the second swing member 222, of a portion of the panel body 11 connected to the first swing member 221.

Because maximum distances between the first swing member 221 and the rotation axial line 222*m* of the second swing member 222 in the folded state and in the unfolded state are different, with a greater maximum distance in the folded state, the panel body 11 and the support layer 12 move in staggered directions under the action of the first swing members 221 and the second swing members 222 when the folded state is switched to the unfolded state or the unfolded state is switched to the folded state. In addition, the maximum distance between the first swing member 221 and the rotation axial line 222*m* of the second swing member 222 in the folded state is greater than that in the unfolded state. Therefore, the bent portion of the panel body 11 and the bent portion of the support layer 12 are separated from each other under the effect of the first swing members 221 and the second swing members 222 in the folded state. For example, as shown in FIG. 5, the gap A is formed between the bent portions of the panel body 11 and the support layer 12 which is equivalent to separately bending the panel body 11 and the support layer 12, and the bent portion of the support layer 12 does not exert an acting force on the panel body 11 any more, which reduces stress on the bent portion of the panel body 11, so that the panel body 11 is less prone to damage and has a longer service life.

Figure 9:
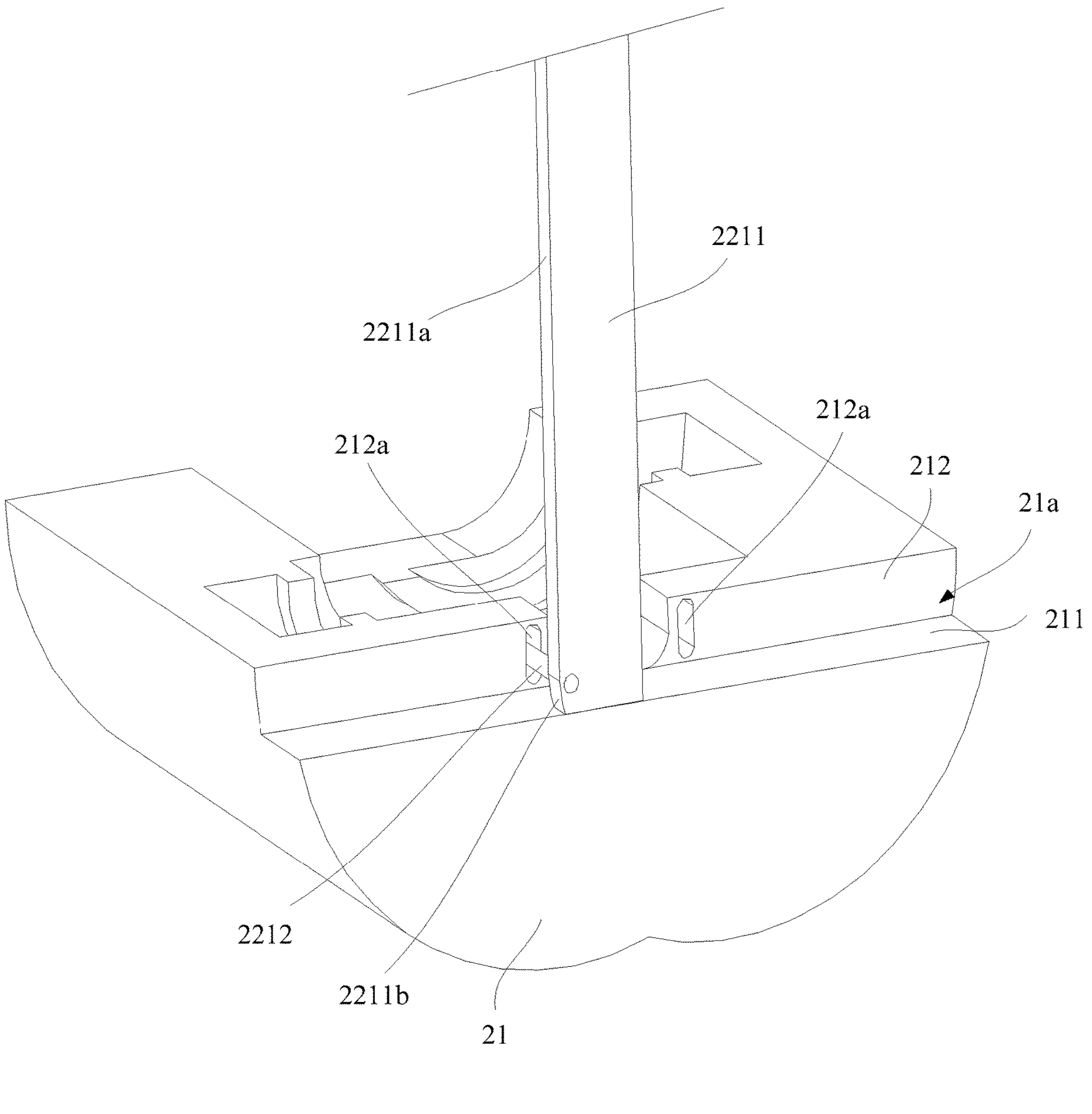
FIG. 9 is a schematic diagram of a local structure of a folding bracket according to an embodiment of the present disclosure.
Figure 10:
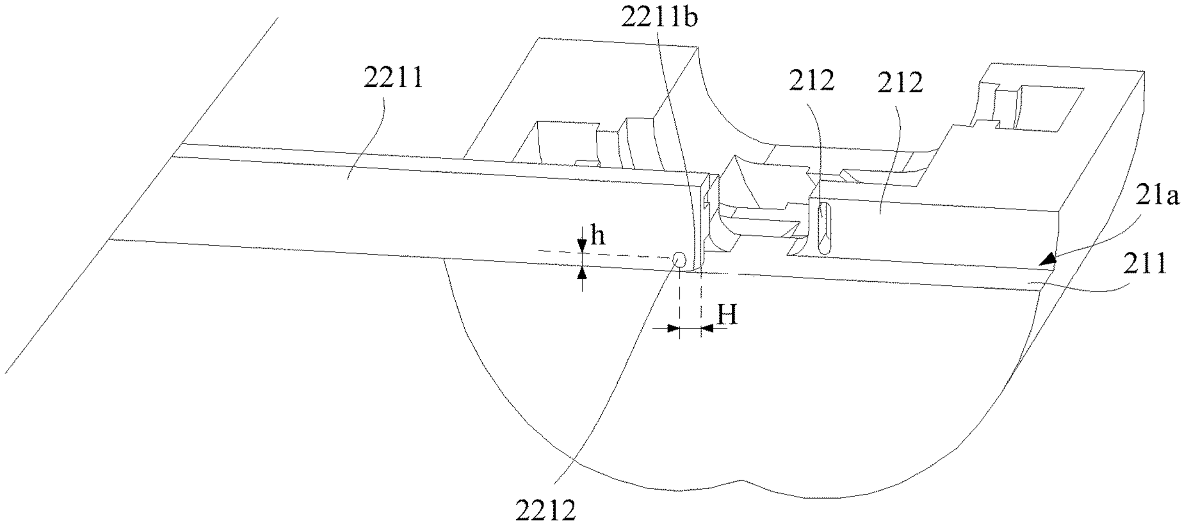
FIG. 10 is a schematic diagram of a local structure of a folding bracket according to an embodiment of the present disclosure.

FIG. 9 and FIG. 10 are schematic diagrams of local structures of a folding bracket according to an embodiment of the present disclosure. FIG. 9 shows a folded state and FIG. 10 shows an unfolded state. As shown in FIG. 9 and FIG. 10, a surface of the base 21 proximal to the flexible display panel 10 is provided with a mounting groove 21*a*. The mounting groove 21*a* includes a bottom wall 211 and at least one side wall 212.

The first swing member 221 includes a swing arm 2211 and a pin shaft 2212. A first end of the swing arm 2211 is disposed in the mounting groove 21*a* and a second end of the swing arm 2211 is disposed outside the mounting groove 21*a*. The pin shaft 2212 is connected to the swing arm 2211 and the side wall 212 of the mounting groove 21*a*.

In the unfolded state, a side surface of the swing arm 2211 is in contact with the bottom wall 211 of the mounting groove 21*a*. A distance H from the pin shaft 2212 to an end surface of the first end of the swing arm 2211 is greater than a distance h from the pin shaft 2212 to the bottom wall 211 of the mounting groove 21*a*. In the folded state, the end surface of the first end of the swing arm 2211 is in contact with the bottom wall 211 of the mounting groove 21*a*.

In the unfolded state and the folded state, different surfaces of the swing arm 2211 are in contact with the bottom wall 211 of the mounting groove 21*a*. In the unfolded state, the side surface of the swing arm 2211 is in contact with the bottom wall 211 of the mounting groove 21*a*. In the folded state, the end surface of the first end of the swing arm 2211 is in contact with the bottom wall 211 of the mounting groove 21*a*. Because the distance H is greater than the distance h, in a process of switching the unfolded state to the folded state, with the rotation of the swing arm 2211, the first end of the swing arm 2211 interacts with the bottom wall 211 of the mounting groove 21*a*, and the swing arm 2211 is pushed to move relative to the second swing member 222, thereby achieving the staggered movement of the panel body 11 and the support layer 12.

In some examples, in the unfolded state, the axis of the pin shaft 2212 may coincide with the rotation axial line 222*m* of the second swing member 222, that is, in this case, the rotation axial line of the first swing member 221 coincides with the rotation axial line of the second swing member 222. In some other examples, in the unfolded state, the axis of the pin shaft 2212 may not coincide with the rotation axial line 222*m* of the second swing member 222.

In the folded state, the axis of the pin shaft 2212 does not coincide with the rotation axial line 222*m* of the second swing member 222.

As an example, with reference to FIG. 4, in the unfolded state, at two opposite side edges of the flexible display panel 10 distal from the base 21, an edge of the panel body 11 is aligned with an edge of the support layer 12. In other words, an orthographic projection, on the back surface of the panel body 11, of the side edge of the support layer 12 distal from the base 21 coincides with or partially coincides with the side edge of the panel body 11 distal from the base 21 (they partially coincide with each other in a case that the length of the side edge of the support layer 12 is not equal to the length of the side edge of the panel body 11). With reference to FIG. 5, in the folded state, at the two opposite side edges of the flexible display panel 10 distal from the base 21, the edge of the support layer 12 and the edge of the panel body 11 are staggered with each other. The orthographic projection, on the back surface of the panel body 11, of the side edge of the support layer 12 distal from the base 21 is within the back surface of the panel body 11, and does not coincide with the side edge of the back surface of the panel body 11 distal from the base 21 and the distance between the two is H-h.

As shown in FIG. 9 and FIG. 10, there is a rounded corner 2211*b* at the joint between a first side surface 2211*a* of the swing arm 2211 and the end surface of the first end of the swing arm 2211. Herein, the first side surface 2211*a* is the side surface of the swing arm 2211 in contact with the bottom wall 211 of the mounting groove 21*a* in the unfolded state.

In a rotating process of the swing arm 2211 relative to the base 21, the swing arm 2211 and the base 21 are in contact with each other. The first end of the swing arm 2211 is equivalent to a cam structure. In a process of switching the unfolded state to the folded state, with rotation of the swing arm 2211, the first end of the swing arm 2211 interacts with the bottom wall 211 of the mounting groove 21*a*, so that the swing arm 2211 is pushed to move relative to the second swing member 222. The rounded corner 2211*b* enable the swing arm 2211 to rotate more smoothly until the end surface of the first end of the swing arm 2211 is in contact with the bottom wall 211 of the mounting groove 21*a*.

As shown in FIG. 9, the side wall 212 of the mounting groove 21*a* is provided with a guide groove 212*a*. An angle between an extending direction of the guide groove 212*a* and the bottom wall 211 of the mounting groove 21*a* is not zero degrees. One end of the pin shaft 2212 is connected to the swing arm 2211 and the other end of the pin shaft 2212 is disposed in the guide groove 212*a* and is movable along the guide groove 212*a*.

For example, the angle between the extending direction of the guide groove 212*a* and the bottom wall 211 of the mounting groove 21*a* is 80 degrees to 90 degrees. For example, the extending direction of the guide groove 212*a* is perpendicular to the bottom wall 211.

In a process of switching the unfolded state to the folded state, with rotation of the swing arm 2211, the first end of the swing arm 2211 interacts with the bottom wall 211 of the mounting groove 21*a*, so that the swing arm 2211 is pushed to move relative to the second swing member 222. In this process, the pin shaft 2212 moves in the guide groove 212*a* with the swing arm 2211 and slides to an end of the guide groove 212*a* distal from the bottom wall 211 of the mounting groove 21*a*. The guide groove 212*a* can limit the moving direction of the pin shaft 2212 so that the first swing member 221 rotates smoothly.

Figure 11:
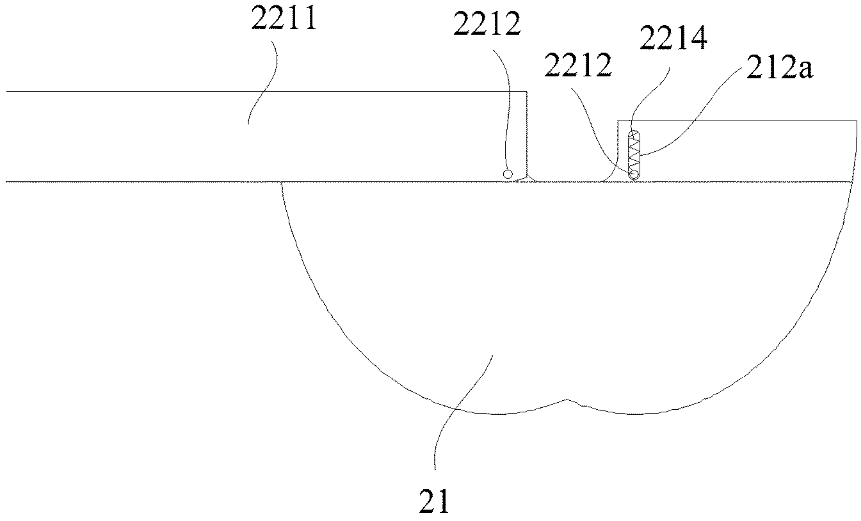
FIG. 11 is a schematic diagram of connection between a swing arm and a base according to an embodiment of the present disclosure.

FIG. 11 is a schematic diagram of connection between a swing arm and a base according to an embodiment of the present disclosure. As shown in FIG. 11, the folding mechanism 22 further includes an elastic member 2214. The elastic member 2214 is disposed in the guide groove 212*a* and is connected to a side wall of the guide groove 212*a* and the pin shaft 2212.

For example, the elastic member 2214 is disposed on a side of the pin shaft 2212 distal from the bottom wall 211 of the mounting groove 21*a*.

An elastic force provided by the elastic member 2214 stabilizes the pin shaft 2212 in the guide groove 212*a*. In a process of switching the unfolded state to the folded state, with rotation of the swing arm 2211, the pin shaft 2212 slides along the guide groove 212*a* to the end of the guide groove 212*a* distal from the bottom wall 211 of the mounting groove 21*a* and the elastic member 2214 is gradually compressed. In a process of switching the folded state to the unfolded state, with rotation of the swing arm 2211, the elastic force of the elastic member 2214 acting on the pin shaft 2212 makes the pin shaft 2212 slide toward the end of the guide groove 212*a* proximal to the bottom wall 211 of the mounting groove 21*a*.

For example, the elastic member 2214 is a spring. In another example, the elastic member 2214 may alternatively be a spring leaf or another component that can provide an elastic force.

Figure 12:
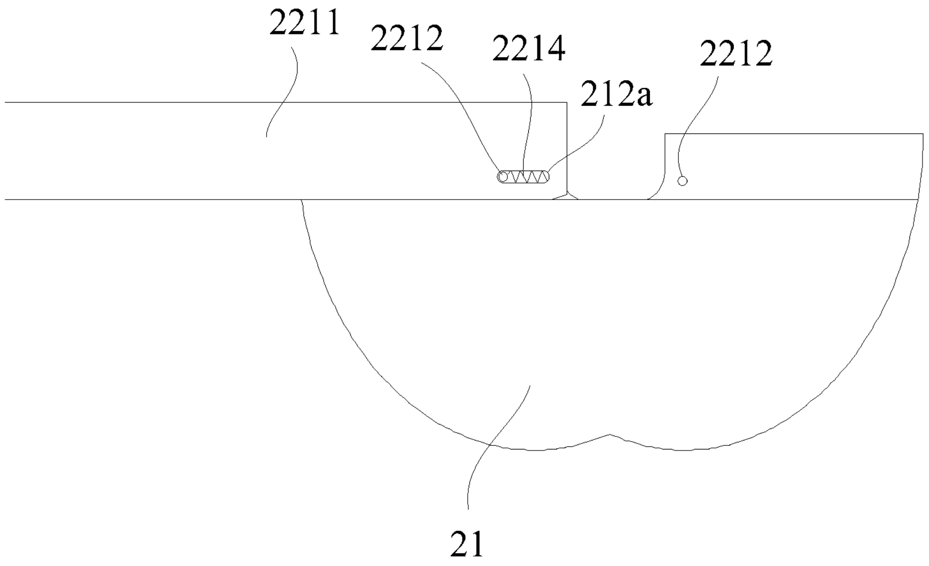
FIG. 12 is a schematic diagram of connection between another swing arm and a base according to an embodiment of the present disclosure.

FIG. 12 is a schematic diagram of connection between another swing arm and a base according to an embodiment of the present disclosure. As shown in FIG. 12, in this example, a surface of the swing arm 2211 is provided with a guide groove 212*a*. The guide groove 212*a* extends along the length direction of the swing arm 2211. One end of the pin shaft 2212 is connected to the side wall 212 of the mounting groove 21*a*, and the other end of the pin shaft 2212 is disposed in the guide groove 212*a* and is movable along the guide groove 212*a*.

In this example, in the unfolded state, a side surface of the swing arm 2211 is in contact with the bottom wall 211 of the mounting groove 21*a*. In this case, a distance between the pin shaft 2212 and the end surface of the first end of the swing arm 2211 is relatively large. In a process of switching the unfolded state to the folded state, with rotation of the swing arm 2211, the pin shaft 2212 moves in the guide groove 212*a* towards the end surface of the first end of the swing arm 2211 and the distance between the pin shaft 2212 and the end surface of the first end of the swing arm 2211 is reduced gradually.

In this example, the guide groove 212*a* may also be provided with an elastic member 2214 inside. For example, the elastic member 2214 is disposed on the side of the pin shaft 2212 proximal to the end surface of the first end of the swing arm 2211. In a process of switching the unfolded state to the folded state, with rotation of the swing arm 2211, the pin shaft 2212 slides in the guide groove 212*a* towards the end surface of the first end of the swing arm 2211 and the elastic member 2214 is compressed gradually. In a process of switching the folded state to the unfolded state, with rotation of the swing arm 2211, an elastic force exerted by the elastic member 2214 on the pin shaft 2212 makes the pin shaft 2212 slide away from the end surface of the first end of the swing arm 2211.

Figure 13:
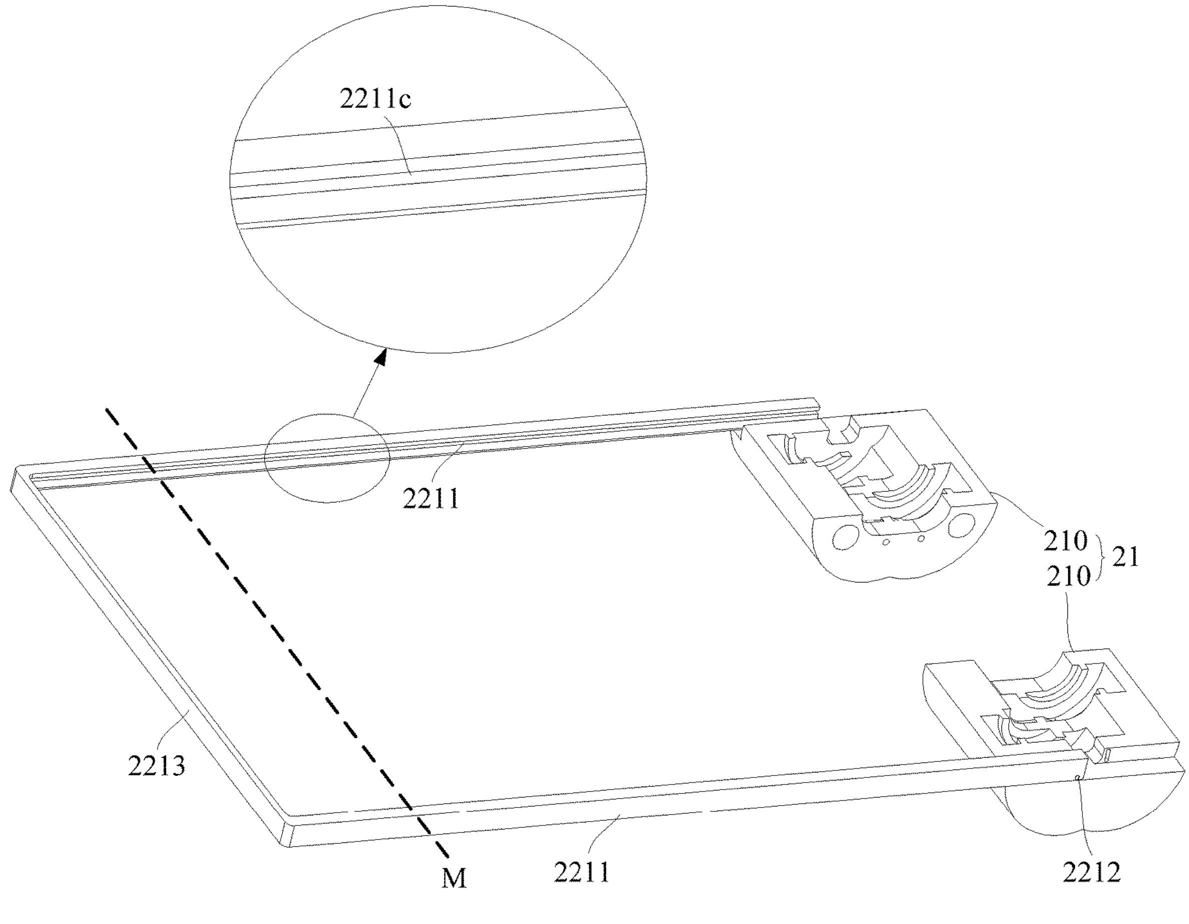
FIG. 13 is a schematic diagram of connection between a first swing member and a base according to an embodiment of the present disclosure.

FIG. 13 is a schematic diagram of connection between a first swing member and a base according to an embodiment of the present disclosure. As shown in FIG. 13, the first swing member 221 may include two swing arms 2211 and two pin shafts 2212. Each swing arm 2211 is connected to the base 21 through one pin shaft 2212 and the two pin shafts 2212 are disposed coaxially. By arranging the two swing arms 2211, the panel body 11 can be supported better, so that the display apparatus can be folded more stably.

In this embodiment of the present disclosure, the first swing member 221 further includes a connecting rod 2213 disposed between the two swing arms 2211. Two ends of the connecting rod 2213 are respectively connected to second ends of the two swing arms 2211. The connecting rod 2213 and the two swing arms 2211 form a frame-shaped structure having an opening in one edge. This can not only make the structure of the display apparatus more stable, but also make connection to and supporting of the panel body 11 better.

For example, the connecting rod 2213 and the two swing arms 2211 may be respectively connected to three side edges of the panel body 11. For example, it is connected to the panel body 11 by bonding.

As shown in FIG. 2, edges of the cover plate 114 exceed the bottom film 111, the display function layer 112, and the polarizer 113. The bottom film 111, the display function layer 112, and the polarizer 113 may be in the frame-shaped structure. The portions of the edges of the cover plate 114 that exceed the bottom film 111, the display function layer 112, and the polarizer 113 are connected to the connecting rod 2213 and the two swing arms 2211. Because the edges of the cover plate 114 exceed the bottom film 111, the display function layer 112, and the polarizer 113, relatively large areas are provided for connection to the connecting rod 2213 and the two swing arms 2211. The frame-shaped structure surrounds the bottom film 111, the display function layer 112, and the polarizer 113, and can also play a role in protecting the bottom film 111, the display function layer 112, and the polarizer 113.

For the display apparatus having a relatively small size, the first swing member 221 is connected to the base 21 through one swing arm 2211, the rotation of the first swing member 221 is relatively stable. For the display apparatus having a relatively large size, the first swing member 221 may be connected to the base 21 through two swing arms 2211, so as to improve the rotation stability of the first swing member 221.

As shown in FIG. 13, a surface of the swing arm 2211 is further provided with a guide slot 2211*c*. The guide slot 2211*c* extends along the length direction of the swing arm 2211. The guide slot 2211*c* is used for connecting the second swing member 222.

The second swing member 222 is connected to the guide slot 2211*c* and is slidable along the guide slot 2211*c* relative to the swing arm 2211.

In a process of unfolding and folding the two folding mechanisms 22 relative to each other, the second swing member 222 slides relative to the swing arm 2211 along the guide slot 2211*c*. The guide slot 2211*c* not only connects the first swing member 221 to the second swing member 222, but also limits relative moving directions of the first swing member 221 and the second swing member 222, thereby making relative movement of the first swing member 221 and the second swing member 222 more stable.

In this embodiment of the present disclosure, the first swing member 221 includes two swing arms 2211. Each swing arm 2211 is provided with the guide slot 2211*c*. The guide slots 2211*c* are in opposite surfaces of the two swing arms 2211, that is, the guide slots 2211*c* of the two swing arms 2211 are opposite to each other, so that the two swing arms 2211 can fit the second swing member 222 from two sides of the second swing member 222 respectively. Therefore, the first swing member 221 and the second swing member 222 can move relative to each other more smoothly.

Figure 14:
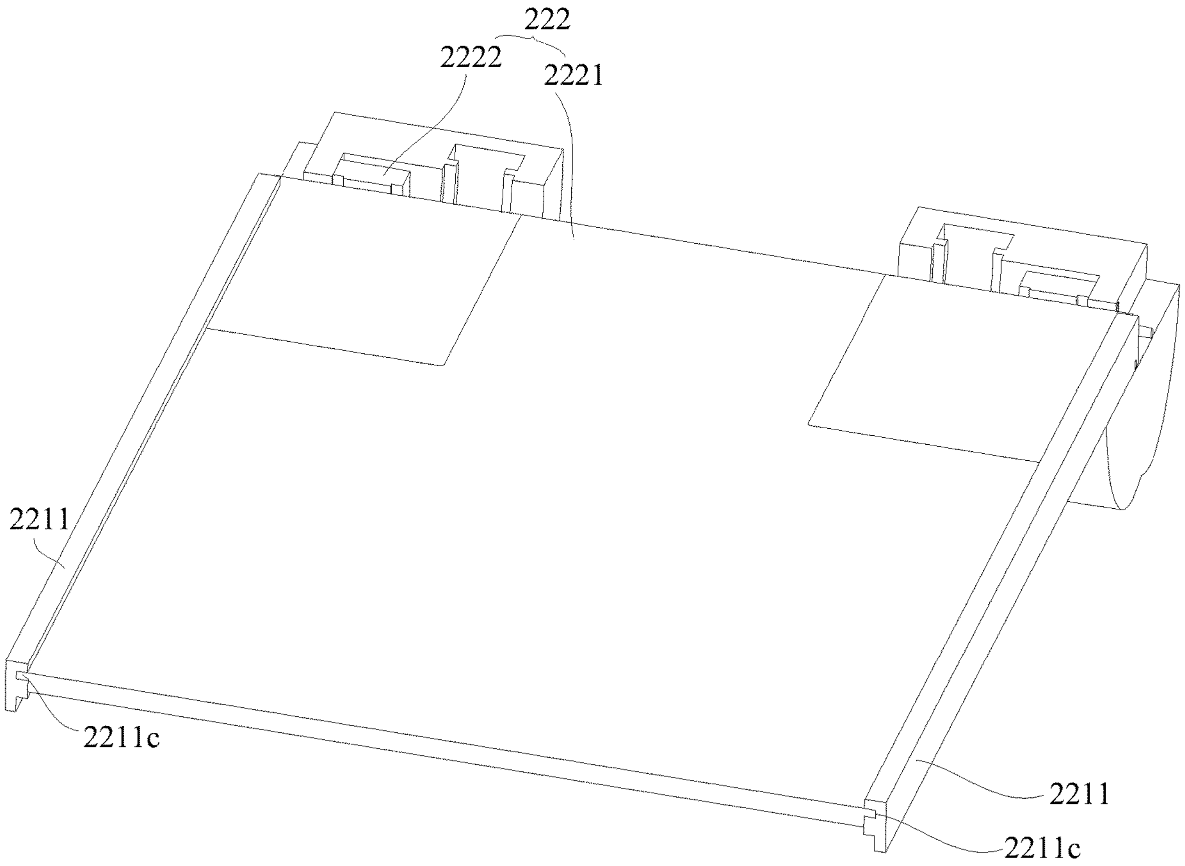
FIG. 14 is a schematic diagram of connection between a first swing member and a second swing member according to an embodiment of the present disclosure.

FIG. 14 is a schematic diagram of connection between a first swing member and a second swing member according to an embodiment of the present disclosure. FIG. 14 shows a section along the dashed line M in FIG. 13. As shown in FIG. 14, the second swing member 222 includes a support plate 2221. An edge of the support plate 2221 is disposed in the guide slot 2211*c*.

The support plate 2221 can provide a relatively large area to support the flexible display panel 10, so that the flexible display panel 10 is kept flat in the unfolded state.

The edge of the support plate 2221 extends into the guide slot 2211*c* and fits the guide slot 2211*c*, so that the support plate 2221 can move relative to the swing arm 2211 along the guide slot 2211*c*.

For example, the support layer 12 may be adhered to the support plate 2221. For example, it is adhered to the support plate 2221 by a pressure-sensitive adhesive.

The support plate 2221 may be a single plate or may be formed by connecting a plurality of plates. For example, the support plate 2221 shown in FIG. 14 is formed by connecting two relatively small plates and one relatively large plate. For example, the plurality of plates are connected through screws.

Figure 15:
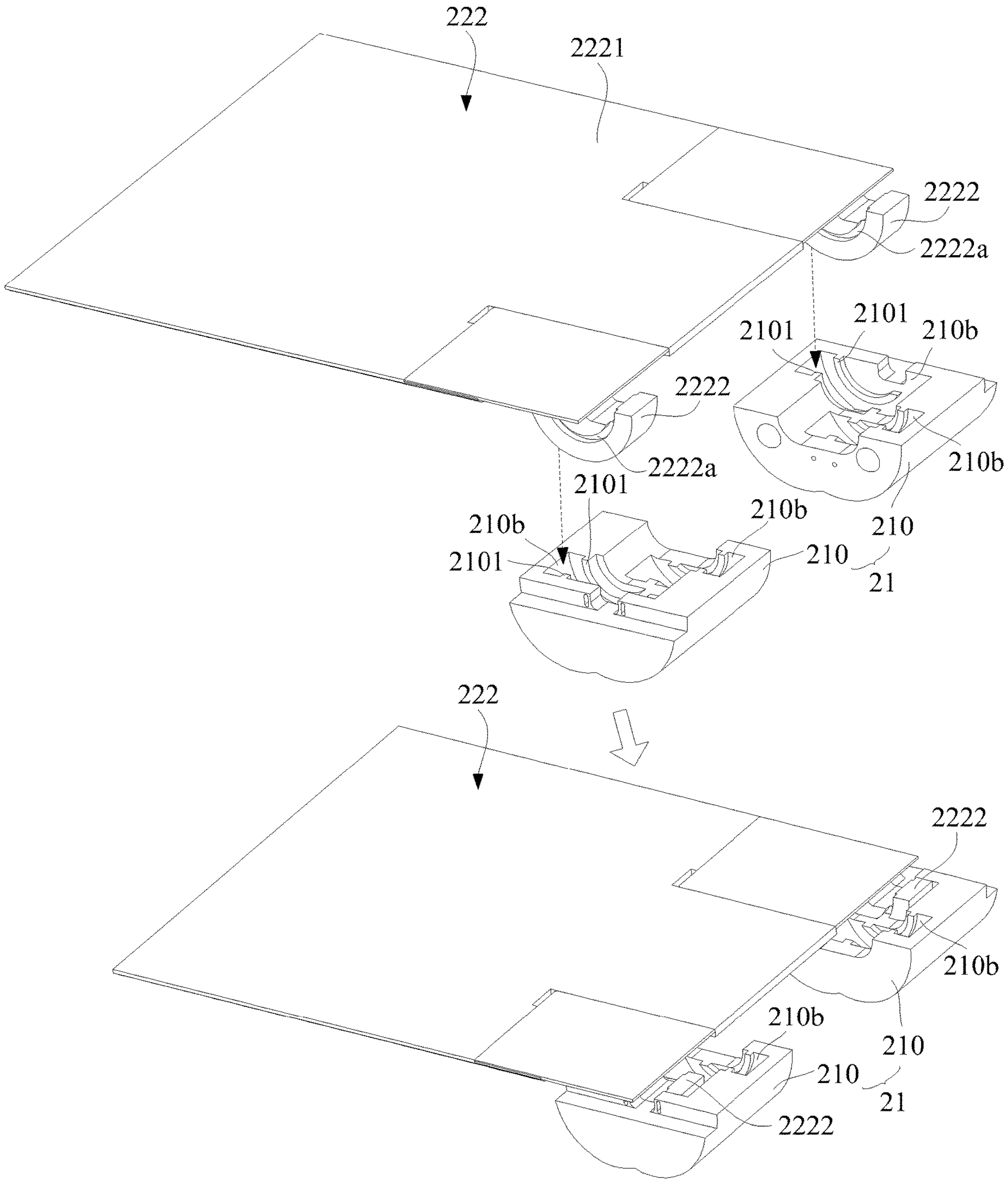
FIG. 15 is a schematic diagram of connection between a second swing member and a base according to an embodiment of the present disclosure.

FIG. 15 is a schematic diagram of connection between a second swing member and a base according to an embodiment of the present disclosure. As shown in FIG. 15, a surface of the base 21 proximal to the flexible display panel 10 is provided with an arc-shaped groove 210*b*.

The second swing member 222 further includes an arc-shaped arm 2222. The arc-shaped arm 2222 is disposed on the side of the support plate 2221 distal from the flexible display panel 10 and is disposed on the edge of the support plate 2221 proximal to the base 21. One end of the arc-shaped arm 2222 is connected to the support plate 2221 and the other end of the arc-shaped arm 2222 is disposed in the arc-shaped groove 210*b*.

The arc-shaped arm 2222 fits the arc-shaped groove 210*b*, so that the second swing member 222 can rotate relative to the base 21. The rotation axial line of the second swing member 222 is the axis of the arc-shaped groove 210*b*.

A connection form of the arc-shaped arm 2222 and the arc-shaped groove 210*b* is used to enable the second swing member 222 to move around a virtual axis. The virtual axis refers to an axis located outside a structure and does not pass through the structure, for example, an axis located outside the second swing member 222 and does not pass through the second swing member 222. In contrast to the virtual axis, a connection using a pin shaft, for example, the connection between the first swing member 221 and the base 21, the rotation axial line of the first swing member 221 is the axis of the pin shaft 2212 and the rotation axial line passes through the first swing member 221. Because the rotation axial line of the second swing member 222 is the axis of the arc-shaped groove 210*b* and is a virtual axis, the position of the rotation axial line of the second swing member 222 can be changed by adjusting the radius of the arc-shaped groove 210*b* and the radius of the arc-shaped arm 2222. The design is more flexible and facilitates adjustment of a movement track of the second swing member 222.

The second swing member 222 may include two or more arc-shaped arms 2222. The radius of each of the arc-shaped arms 2222 is the same. The axes of all the arc-shaped arms 2222 coincide with each other. For example, in this embodiment of the present disclosure, the second swing member

222 includes two arc-shaped arms 2222. The two arc-shaped arms 2222 fit the two arc-shaped grooves 210*b* on the base 21 respectively.

For the display apparatus having a relatively small size, the second swing member 222 is connected to the base 21 through one arc-shaped arm 2222, and the rotation of the second swing member 222 is relatively stable. For the display apparatus having a relatively large size, the second swing member 222 may be connected to the base 21 through two or more arc-shaped arms 2222, so as to improve the rotation stability of the second swing member 222.

As shown in FIG. 15, a side wall of the arc-shaped groove 210*b* and a side wall of the arc-shaped arm 2222 are further provided with matched guide structures. In this embodiment of the present disclosure, the side wall of the arc-shaped groove 210*b* is provided with an arc-shaped flange 2101. The axis of the flange 2101 coincides with the axis of the arc-shaped groove 210*b*. The side wall of the arc-shaped arm 2222 is provided with an arc-shaped concave groove 2222*a*. The axis of the concave groove 2222*a* coincides with the axis of the arc-shaped arm 2222. The flange 2101 is disposed in the concave groove 2222*a*. In a rotating process of the second swing member 222, the flange 2101 slides in the concave groove 2222*a*. Because the flange 2101 fits the concave groove 2222*a*, the second swing member 222 can rotate more stably.

In another example, the position of the flange 2101 and the position of the concave groove 2222*a* may be exchanged. For example, the side wall of the arc-shaped groove 210*b* is provided with the concave groove 2222*a*. The axis of the concave groove 2222*a* coincides with the axis of the arc-shaped groove 210*b*. The side wall of the arc-shaped arm 2222 is provided with the flange 2101. The axis of the flange 2101 coincides with the axis of the arc-shaped arm 2222.

As shown in FIG. 15, on the surface of the base 21 proximal to the flexible display panel 10, the arc-shaped grooves 210*b* that are connected to the second swing members 222 of the two folding mechanisms 22 are staggered in a direction parallel to the axes of the arc-shaped grooves 210*b* which is beneficial to saving space.

The base 21 may include two sub-bases 210 and the two sub-bases 210 are spaced from each other. For example, in this embodiment of the present disclosure, the first swing member 221 includes two swing arms 2211. The second swing member 222 includes two arc-shaped arms 2222. One of the two swing arms 2211 of the first swing member 221 and one of the two arc-shaped arms 2222 of the second swing member 222 are connected to one of the two sub-bases 210. The other swing arm 2211 of the first swing member 221 and the other arc-shaped arm 2222 of the second swing member 222 are connected to the other sub-base 210. By connecting two mutually spaced sub-bases 210 to the folding mechanism 22, it is beneficial to reduce the volume of the base 21 and the weight of the display apparatus.

In some examples, the two sub-bases 210 may alternatively be connected into a whole. For example, the two sub-bases 210 are detachably connected to each other through a connector, which may be a screw or the like. For another example, the two sub-bases 210 are made into a whole according to an integrated molding process.

Figure 16:
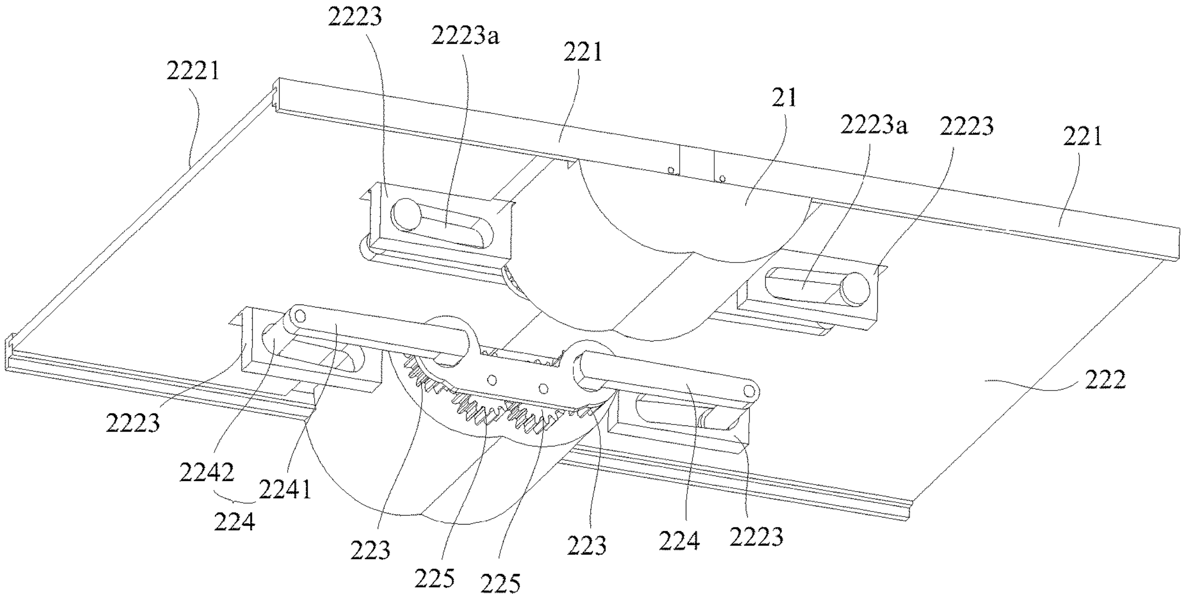
FIG. 16 is a schematic structural diagram of a folding mechanism according to an embodiment of the present disclosure.

FIG. 16 is a schematic structural diagram of a folding mechanism according to an embodiment of the present disclosure. As shown in FIG. 16, the folding mechanism 22 further includes a first synchronous gear 223 and a synchronous swing arm 224. The first synchronous gear 223 is rotatably connected to the base 21. The rotation axial line of the first synchronous gear 223 is parallel to the rotation axial line of the second swing member 222. The first synchronous gears 223 of the two folding mechanisms 22 are in transmission connection with each other.

One end of the synchronous swing arm 224 is connected to the first synchronous gear 223. The other end of the synchronous swing arm 224 is movably connected to the second swing member 222. The synchronous swing arm 224 is used to drive the first synchronous gear 223 to rotate under the action of the second swing member 222.

For example, in this embodiment of the present disclosure, second synchronous gears 225 are also disposed between the first synchronous gears 223 of the two folding mechanisms 22. The first synchronous gears 223 of the two folding mechanisms 22 engage with the second synchronous gears 225. In another example, the first synchronous gears 223 of the two folding mechanisms 22 may alternatively engage with each other.

The transmission connection between the first synchronous gears 223 of the two folding mechanisms 22 enable the synchronous swing arms 224 of the two folding mechanisms 22 to rotate synchronously in different rotation directions and thus drive the two folding mechanisms 22 to rotate synchronously and be unfolded and folded relative to each other.

As shown in FIG. 16, the second swing member 222 further includes a connecting portion 2223 connected to the support plate 2221. The connecting portion 2223 is disposed on the side of the support plate 2221 distal from the flexible display panel 10 and is disposed on a side of the synchronous swing arm 224. The connecting portion 2223 is provided with a sliding groove 2223*a*. The synchronous swing arm 224 slidingly matches up with the sliding groove 2223*a*.

In this example, the synchronous swing arm 224 includes a rod portion 2241 and a sliding portion 2242. One end of the rod portion 2241 is connected to the first synchronous gear 223. The other end of the rod portion 2241 is connected to the sliding portion 2242. The sliding portion 2242 is disposed in the sliding groove 2223*a* and is movable along the sliding groove 2223*a*.

The rotation axial line of the synchronous swing arm 224 is the axis of the first synchronous gear 223. In this embodiment of the present disclosure, the axis of the first synchronous gear 223 does not coincide with the rotation axial line of the second swing member 222. In a process of unfolding and folding the two folding mechanisms 22 relative to each other, the second swing member 222 rotates around the axis of the arc-shaped groove 210*b*. The synchronous swing arm 224 rotates around the axis of the first synchronous gear 223. The sliding groove 2223*a* is provided so that the sliding portion 2242 can move in the sliding groove 2223*a* to avoid the second swing member 222, the base 21 and the synchronous swing arm 224 locking each other and being not able to move.

Figure 17:
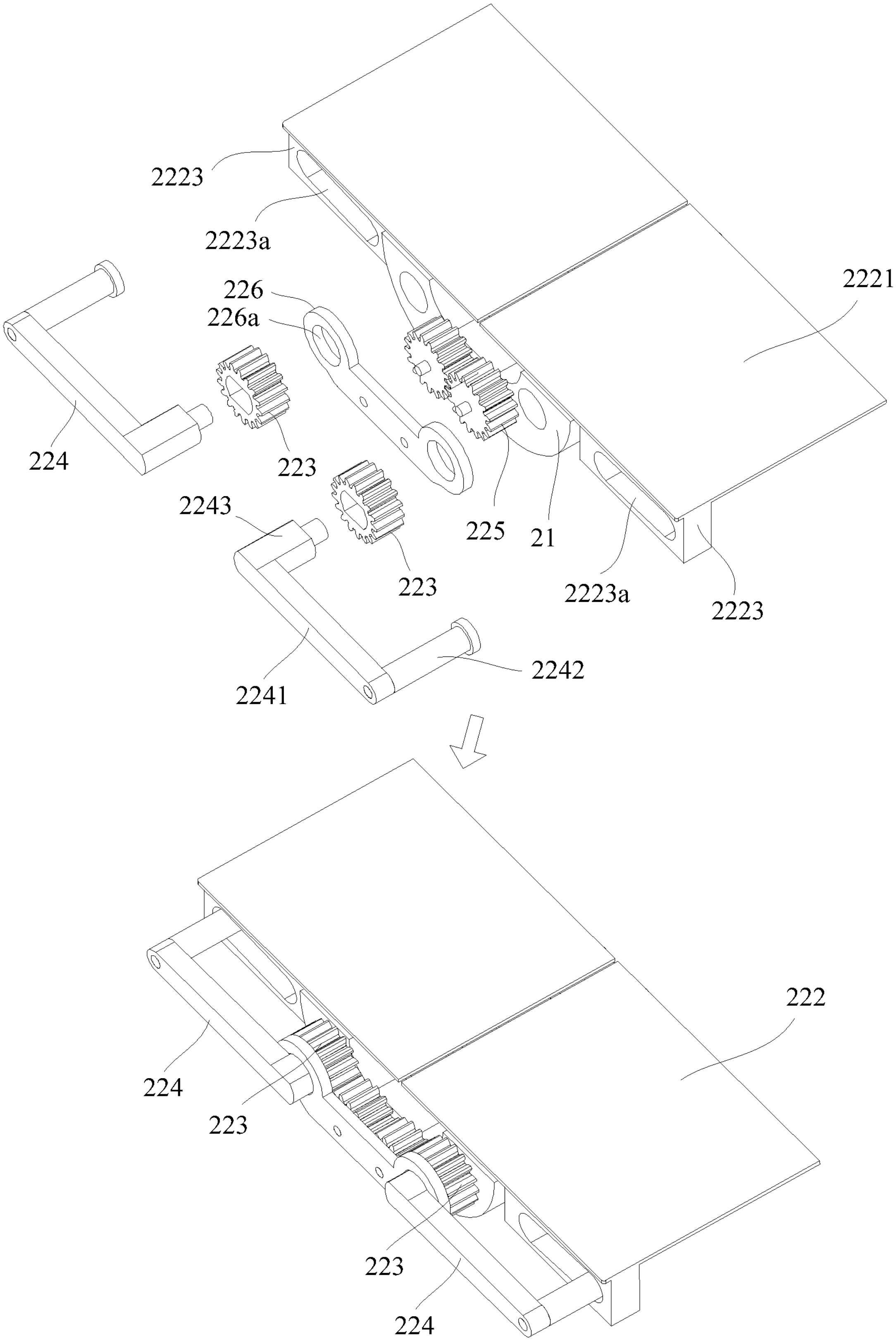
FIG. 17 is a schematic mounting diagram of a synchronous swing arm according to an embodiment of the present disclosure.

FIG. 17 is a schematic mounting diagram of a synchronous swing arm according to an embodiment of the present disclosure. As shown in FIG. 17, the synchronous swing arm 224 further includes a mounting shaft 2243. The mounting shaft 2243 is disposed at an end of the rod portion 2241. The first synchronous gear 223 sleeves on the mounting shaft 2243, and is positioned at the circumference of the mounting shaft 2243, that is, the first synchronous gear 223 and the mounting shaft 2243 cannot rotate relative to each other. The mounting shaft 2243 is rotatably connected to the base 21, so that the first synchronous gear 223 is mounted onto the base 21 and can rotate relative to the base 21.

In this embodiment of the present disclosure, two second synchronous gears 225 are also disposed between the first synchronous gears 223 of the two folding mechanisms 22. The display apparatus may further include a mounting plate 226, so that the second synchronous gears 225 can be mounted stably. One side of each second synchronous gear 225 is rotatably connected to the base 21. The other end of the second synchronous gear 225 is rotatably connected to the mounting plate 226. The second synchronous gear 225 is supported from two sides of the second synchronous gear 225 by the mounting plate 226 and the base 21, so that the second synchronous gear 225 can rotate stably.

As shown in FIG. 17, the mounting plate 226 is provided with two connecting holes 226*a*. The two connecting holes 226*a* respectively sleeve on the mounting shafts 2243 of the synchronous swing arms 224 of the two folding mechanisms 22. The connecting holes 226*a* are in clearance fit with the mounting shafts 2243. The connecting holes 226*a* do not affect rotation of the synchronous swing arms 224 and sleeving the connecting holes 226*a* on the mounting shafts 2243 provides support to the mounting plate 226 and avoids loosening of the mounting plate 226.

Figure 18:
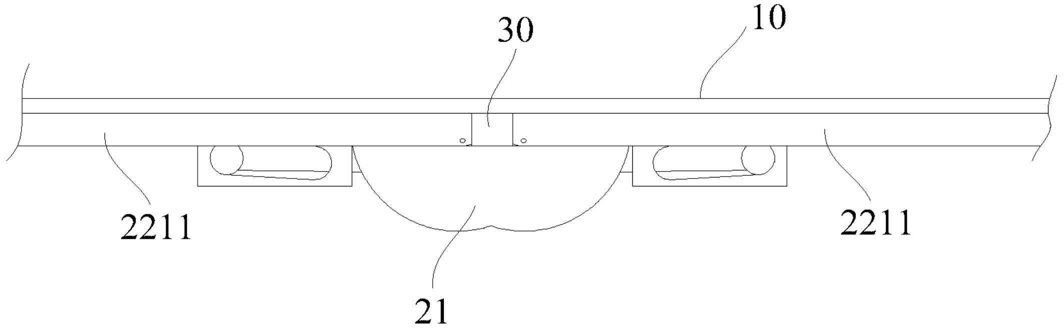
FIG. 18 is a schematic structural diagram of a display apparatus according to an embodiment of the present disclosure.

FIG. 18 is a schematic structural diagram of a display apparatus according to an embodiment of the present disclosure. As shown in FIG. 18, the display apparatus may further include a flexible block 30. In the unfolded state, the flexible block 30 is disposed between the end surfaces at the first ends of the swing arms 2211 of the two folding mechanisms 22, and is used for filling a gap. In the unfolded state, the gap is among the flexible display panel 10, the base 21, and the end surfaces at the first ends of the swing arms 2211 of the two folding mechanisms 22. In a process of unfolding and folding the two folding mechanisms 22, the flexible block 30 can deform under the extrusion of the swing arms 2211, thereby filling the gap without affecting movement of the swing arms 2211.

For example, the flexible block 30 is foam. In some examples, the flexible block may alternatively be a blocky structure made of silica gel or another flexible material.

The foregoing descriptions are merely optional embodiments of the present disclosure, but are not intended to limit the present disclosure. Any modification, equivalent replacement, or improvement made without departing from the spirit and principle of the present disclosure shall fall within the protection scope of the present disclosure.

What is claimed is:

1. A display apparatus, comprising a folding bracket and a flexible display panel, wherein, the folding bracket comprises a base and two folding mechanisms, and the two folding mechanisms are rotatably connected to the base respectively and are capable of being unfolded and folded relative to each other;

the flexible display panel comprises a support layer and a panel body that are separated from each other, the support layer is disposed on a back surface of the panel body, the back surface is a surface opposite to a display surface of the panel body, and each of the support layer and the panel body is connected to the two folding mechanisms; and each of the two folding mechanisms is configured to drive the panel body and the support layer to move in staggered directions, in a case that the two folding mechanisms are unfolded relative to each other, a moving direction of the panel body relative to the support layer points to the base, and in a case that the two folding mechanisms are folded relative to each other, the moving direction of the panel body relative to the support layer points away from the base;

each of the two folding mechanisms comprises a first swing member and a second swing member;

the first swing member and the second swing member are rotatably connected to the base separately, and the first swing member and the second swing member are slidably connected to each other;

the first swing member is movable in a direction towards or away from the base relative to the second swing member; and a maximum distance between the first swing member and a rotation axial line of the second swing member in a folded state is greater than a maximum distance between the first swing member and the rotation axial line of the second swing member in an unfolded state.

2. The display apparatus according to claim 1, wherein the support layer is connected to the second swing member of each of the two folding mechanisms, and the panel body is connected to the first swing member of each of the two folding mechanisms.

3. The display apparatus according to claim 2, wherein a surface of the base proximal to the flexible display panel is provided with a mounting groove, and the mounting groove comprises a bottom wall and at least one side wall; and the first swing member comprises a swing arm and a pin shaft, a first end of the swing arm is disposed in the mounting groove, a second end of the swing arm is disposed outside the mounting groove, and the pin shaft is connected to the swing arm and the side wall.

4. The display apparatus according to claim 3, wherein in the unfolded state, a side surface of the swing arm is in contact with the bottom wall and a distance from the pin shaft to an end surface of the first end of the swing arm is greater than a distance from the pin shaft to the bottom wall; and in the folded state, the end surface of the first end of the swing arm is in contact with the bottom wall.

5. The display apparatus according to claim 4, wherein there is a rounded corner at a joint between a first side surface of the swing arm and the end surface of the first end of the swing arm, and the first side surface is a side surface of the swing arm in contact with the bottom wall in the unfolded state.

6. The display apparatus according to claim 4, wherein the side wall is provided with a guide groove, an angle between an extending direction of the guide groove and the bottom wall is not zero degrees, one end of the pin shaft is connected to the swing arm and the other end of the pin shaft is disposed in the guide groove and is movable along the guide groove; or a surface of the swing arm is provided with a guide groove, the guide groove extends along a length direction of the swing arm, one end of the pin shaft is connected to the side wall and the other end of the pin shaft is disposed in the guide groove and is movable along the guide groove.

7. The display apparatus according to claim 6, wherein the extending direction of the guide groove is perpendicular to the bottom wall.

8. The display apparatus according to claim 6, wherein the folding mechanism further comprises an elastic member, and the elastic member is disposed in the guide groove and is connected to a side wall of the guide groove and the pin shaft.

9. The display apparatus according to claim 3, wherein a surface of the swing arm is provided with a guide slot, and the guide slot extends along a length direction of the swing arm; and the second swing member is connected to the guide slot and is slidable along the guide slot relative to the swing arm.

10. The display apparatus according to claim 9, wherein the second swing member comprises a support plate, and an edge of the support plate is disposed in the guide slot.

11. The display apparatus according to claim 10, wherein the surface of the base proximal to the flexible display panel is provided with an arc-shaped groove; and the second swing member further comprises an arc-shaped arm, the arc-shaped arm is disposed on a side of the support plate distal from the flexible display panel and is disposed on an edge of the support plate proximal to the base, and one end of the arc-shaped arm is connected to the support plate and the other end of the arc-shaped arm is disposed in the arc-shaped groove.

12. The display apparatus according to claim 10, wherein the folding mechanism further comprises a first synchronous gear and a synchronous swing arm, the first synchronous gear is rotatably connected to the base, a rotation axial line of the first synchronous gear is parallel to the rotation axial line of the second swing member, and first synchronous gears of the two folding mechanisms are in transmission connection with each other; and one end of the synchronous swing arm is connected to the first synchronous gear, the other end of the synchronous swing arm is movably connected to the second swing member, and the synchronous swing arm is configured to drive the first synchronous gear to rotate under an action of the second swing member.

13. The display apparatus according to claim 12, wherein the second swing member further comprises a connecting portion connected to the support plate, the connecting portion is disposed on a side of the support plate distal from the flexible display panel and is disposed on a side of the synchronous swing arm, the connecting portion is provided with a sliding groove, and the synchronous swing arm slidingly matches up with the sliding groove.

14. The display apparatus according to claim 13, wherein the synchronous swing arm comprises a rod portion and a sliding portion, one end of the rod portion is connected to the first synchronous gear, the other end of the rod portion is connected to the sliding portion, and the sliding portion is disposed in the sliding groove and is movable along the sliding groove.

15. The display apparatus according to claim 3, wherein the display apparatus further comprises a flexible block; and in the unfolded state, the flexible block is disposed between end surfaces of first ends of swing arms of the two folding mechanisms.

16. The display apparatus according to claim 1, wherein the base comprises two sub-bases which are spaced from each other, and each of the two sub-bases is connected with the two folding mechanisms.

17. The display apparatus according to claim 1, wherein the panel body comprises a bottom film, a display function layer, a polarizer, and a cover plate that are laminated sequentially, and the display function layer comprises a substrate and an organic light-emitting diode disposed on the substrate.

18. The display apparatus according to claim 17, wherein orthographic projections of the bottom film, the display function layer, and the polarizer on a surface of the cover plate are all within the cover plate.

19. The display apparatus according to claim 1, wherein the support layer comprises a support layer main body and a flexible layer, and the flexible layer is disposed on a surface of the support layer main body proximal to the panel body.

* * * * *